(12) United States Patent
Frey

(10) Patent No.: US 6,590,812 B2
(45) Date of Patent: Jul. 8, 2003

(54) MEMORY CELLS INCORPORATING A BUFFER CIRCUIT AND MEMORY COMPRISING SUCH A MEMORY CELL

(75) Inventor: Christophe Frey, Meylan (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 10/178,081

(22) Filed: Jun. 21, 2002

(65) Prior Publication Data

US 2003/0016563 A1 Jan. 23, 2003

(30) Foreign Application Priority Data

Jun. 22, 2001 (FR) .............................. 01 08270

(51) Int. Cl.[7] ................................. G11C 7/10
(52) U.S. Cl. ................... 365/189.05; 365/156; 365/154
(58) Field of Search ................ 365/154, 156, 365/230.05, 189.05

(56) References Cited

U.S. PATENT DOCUMENTS 4,864,540 A * 9/1989 Hashemi et al. ............ 365/179
5,907,502 A    5/1999 Kim ........................... 365/156

* cited by examiner

Primary Examiner—Andrew Q. Tran
(74) Attorney, Agent, or Firm—Lisa K. Jorgenson; Harold H. Bennett, II; Seed IP Law Group PLLC

(57) ABSTRACT

A memory cell is formed with a buffer circuit. The output of the buffer circuit is linked to the input to form a logic latch. A write-access transistor is disposed between a first node linked to a bit line and the input of the buffer circuit. A control gate of the write-access transistor is linked to a second node linked to a write word line, and a read-access transistor is disposed between the first node linked to the bit line and a third node linked to a read word line. A control gate of the read-access transistor is linked to the output of the buffer circuit.

6 Claims, 2 Drawing Sheets

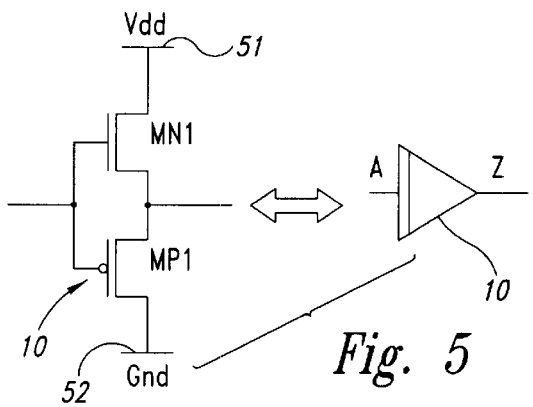
Fig. 5
Fig. 6
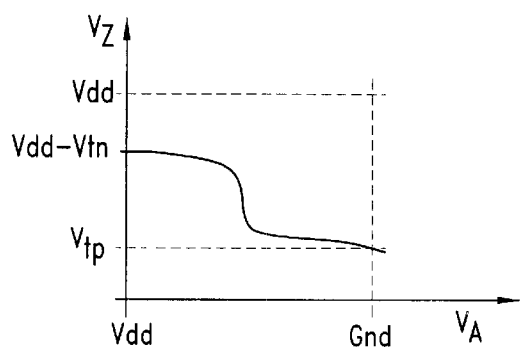
Fig. 7
Fig. 8
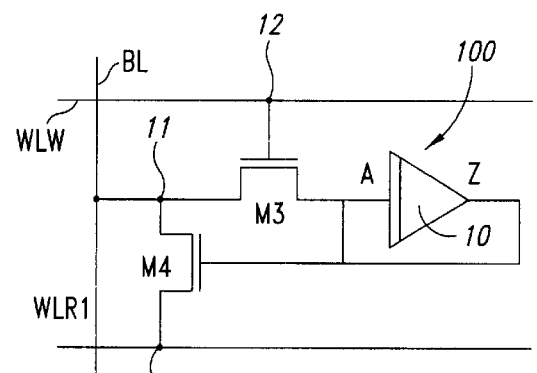
Fig. 9
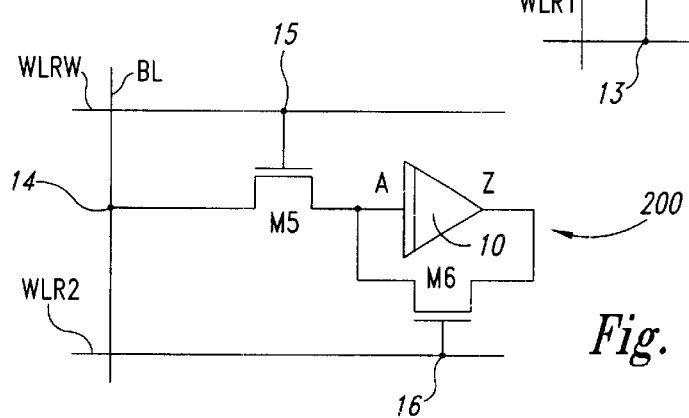
Fig. 10

MEMORY CELLS INCORPORATING A BUFFER CIRCUIT AND MEMORY COMPRISING SUCH A MEMORY CELL

BACKGROUND OF THE INVENTION

1. Field of the Invention

The invention relates to examples of a memory cell incorporating a buffer circuit, and a random access memory comprising such a memory cell.

It relates to the field of circuit design, more particularly using CMOS technology.

It finds applications, in particular, in electronic components, for example integrated-circuit memory circuits (so-called "stand alone" circuits) of SRAM type (Static Random Access Memory) or DRAM type (Dynamic Random Access Memory), microcontrollers, application specific integrated circuits, etc.

2. Description of the Related Art

In the prior art, it is known practice to make a memory cell comprising on the one hand a buffer circuit whose output is linked to the input so as to form a logic latch, and on the other hand read- and/or write-access transistors for carrying out a read and/or write operation in the memory cell. In conventional manner, a buffer circuit comprises two cascaded inverters.

Represented diagrammatically in FIG. 1 is a CMOS technology inverter. The inverter 1 comprises an N type MOS transistor referenced MN11 and a P type MOS transistor referenced MP11, which are disposed in series between a first terminal 11 and a second terminal 12. The terminal 11 is brought to a potential Vdd, and the terminal 12 is brought to a potential Gnd which is less than the potential Vdd. In general, the potential Vdd is a positive supply potential, and the potential Gnd is a negative supply potential or a ground potential. The drains of the transistors MN11 and MP11 are linked together and form the output OUT of the inverter 1. Likewise, the control gates of the transistors MN11 and MP11 are linked together and form the input IN of the inverter 1. Finally, the source of the transistor MP11 is linked to the terminal 11 and the source of the transistor MN11 is linked to the terminal 12. The manner of operation of this inverter is well known to the person skilled in the art and does not call for any particular comments.

Represented diagrammatically in FIG. 2 is a first memory cell known in the prior art. The memory cell 20 comprises a first inverter 2 and a second inverter 3. These are MOS technology inverters such as the one described above with regard to the diagram of FIG. 1. The output of the inverter 2 is linked to the input of the inverter 3 so as to form a buffer circuit. Furthermore, the output of the inverter 3 is linked to the input of the inverter 2 so as to form a logic latch. Furthermore, the cell 20 comprises a first access transistor M2 and a second access transistor M3. These are for example N type MOS transistors. The transistor M2 is disposed between the output of the inverter 2 and a node which is linked to a bit line BL1 of the memory incorporating the memory cell 20. Likewise, the transistor M3 is disposed between the output of the inverter 3 and a node which is linked to a bit line BL2 of the memory incorporating the cell 20. The bit lines BL1 and BL2 are said to be dual, insofar as, during operation, they are brought to mutually symmetric potentials, corresponding to mutually inverse logic levels. The control gates of the access transistors M2 and M3 are linked to a word line WL of the memory incorporating the cell 20. As may be seen, the memory cell 20 of FIG. 2 comprised at least 6 MOS transistors.

In order to reduce the silicon area occupied by a memory cell on a doped silicon substrate, attempts have already been made to reduce the number of MOS transistors comprises in the memory cell.

FIG. 3, in which the same elements as in FIG. 2 bear the same references, shows diagrammatically a second memory cell 30 according to the prior art, which has already been proposed for this purpose. The cell 30 is distinguished from the cell 20 described above with regard to FIG. 2, in that it comprises only four MOS transistors. Specifically, the respective transistors MP11 of the inverter 2 and of the inverter 3 are replaced by respective resistors R1. Since these resistors occupy less silicon area than the P type MOS transistors for which they are substituted, the sought-after reduction of area occupied by the memory cell is obtained.

However, the making of the resistors R1 requires the implementation of a particular process which makes fabrication more complex.

This is why a memory cell of the type of that represented in FIG. 4 has also been proposed. This memory cell 40, known in the prior art, corresponds substantially to the memory cell 30 described above with regard to FIG. 3. It is distinguished therefrom in that the respective resistors R1 of the inverters 2 and 3 are replaced by short-circuits. In reality, the role played by the resistors R1 of the cell 30 of FIG. 3 is played, in the cell 40, by the leakage resistors of the access transistors M2 and M3. For this purpose, the latter are preferably P type MOS transistors with a low threshold voltage, whose leakage resistances are high. Moreover, the respective transistors MN11 of the inverters 2 and 3 are preferably transistors having a high threshold voltage. The cell 40 comprises just four MOS transistors and does not exhibit the aforementioned drawbacks of the memory cell 30 of FIG. 3.

The operation of the memory cell 40 is however difficult to control on account of the difficulty in controlling the leakage currents of the transistors M2 and M3. In particular, the operation of the memory cell 40 is somewhat unreliable for low values of the supply voltage (this voltage being the difference between the potentials Vdd and Gnd).

There is known from U.S. Pat. No. 5,907,502 a buffer circuit comprising an N type MOS transistor and a P type MOS transistor, which are disposed in series between a first terminal brought to a first given potential and a second terminal brought to a second given potential. The second potential is less than the first potential. The sources of the transistors are linked together and form the output of the buffer circuit. The control gates of the transistors are linked together and form the input of the buffer circuit. The drain of the N type MOS transistor is linked to said first terminal and the drain of the P type MOS transistor is linked to said second terminal.

This buffer circuit therefore comprises just two MOS transistors but it may advantageously be substituted for a buffer circuit of known type comprising two CMOS technology inverters in cascade such as in the memory cell 20 described above with regard to the diagram of FIG. 2, which comprises four MOS transistors.

BRIEF SUMMARY OF THE INVENTION

An embodiment of the invention is a memory cell comprising such a buffer circuit, thus occupying a small silicon area.

Embodiments of the invention relate to examples of a memory cell comprising a buffer circuit such as defined above, whose output is linked to the input so as to form a logic latch.

In a first embodiment, a write-access transistor is disposed between a first node linked to a bit line and the input of the buffer circuit. A control gate of the write-access transistor is linked to a second node linked to a write word line, and a read-access transistor is disposed between a first node linked to a bit line and a second node linked to a read word line. A control gate of the read-access transistor is linked to the output of the buffer circuit.

Another embodiment of the invention relates to a random access memory comprising at least one memory cell of the aforementioned type. This is in particular an SRAM type static memory, although the invention is in no way limited to this example.

An embodiment of the invention provides a write- and read-access transistor disposed between a primary node linked to a bit line and the input of the buffer circuit. A control gate of the write- and read-access transistor is linked to a secondary node on a read and write word line. A read-protection transistor is disposed between the input and the output of the buffer circuit, and a control gate of the read-protection transistor is linked to a node on a read word line.

Further embodiments of the invention provide methods of operation of the memory cells.

BRIEF DESCRIPTION OF SEVERAL VIEWS OF THE DRAWINGS

FIG. 5 is the diagram of a buffer circuit;

FIG. 6 is a table illustrating the operation of the buffer circuit from an electrical standpoint;

FIG. 7 is a curve showing the shape of the potential at the output of the buffer circuit as a function of the potential on its input;

FIG. 8 is a logic table illustrating the operation of the buffer circuit from a logic standpoint;

FIG. 9 is the diagram of a first example of a memory cell according to the invention; and FIG. 10 is the diagram of a second example of a memory cell according to the invention.

DETAILED DESCRIPTION OF THE INVENTION

Figure 1:
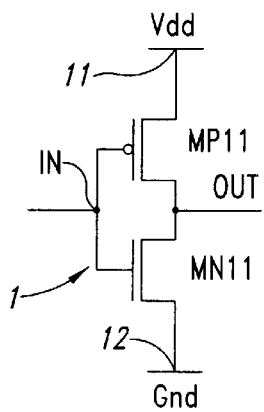
FIG. 1, already described above, is the diagram of a CMOS technology inverter.

Represented diagrammatically in FIG. 5 is a buffer circuit according to the invention.

The circuit 10 comprises an N type MOS transistor referenced MN1 and a P type MOS transistor referenced MP1, which are disposed in series between a terminal 51 and a terminal 52. The terminal 51 is brought to a given potential Vdd. The terminal 52 is brought to a given potential Gnd, which is less than the potential Vdd. In an exemplary embodiment, the potential Vdd is a positive supply potential and the potential Gnd is a ground potential. Nevertheless, the potential Gnd may also be a negative supply potential.

By convention, in the subsequent description, the potential Vdd is associated with a high logic level (1 logic value) and the potential Gnd is associated with a low logic level (0 logic value). Another convention could of course be adopted, the person skilled in the art then immediately perceiving the adaptations of the following description which results therefrom.

The sources of the transistors MN1 and MP1 are linked together and form the output Z of the buffer circuit 10. Furthermore, the control gates of the transistors MN1 and MP1 are linked together and form the input A of the buffer circuit 10. Finally, the drain of the transistor MN1 is linked to the terminal 51 and the drain of the transistor MP1 is linked to the terminal 52. It is recalled that, for a MOS transistor, the source electrode and drain electrode are structurally identical so that their wiring can be inverted without the operation of the transistor being thereby modified, and the designation of these electrodes obeys the following convention: for an N type MOS transistor, the electrode of the transistor which is brought to the lowest potential is designated the "source", and the electrode which is brought to the highest potential is designated the "drain", whereas these designations are reversed for a P type MOS transistor.

As has been understood, the structure of the buffer circuit 10 corresponds to that of a CMOS technology inverter in which the disposition of the N type MOS transistor and of the P type MOS transistor between the terminals 51 and 52 has been inverted.

Where Vtn designates the threshold voltage of the transistor MN1 (threshold voltage of an N type MOS transistor) and where Vtp designates the threshold voltage of the transistor MP1 (threshold voltage of a P type MOS transistor, it is preferable to choose the transistors MN1 and MP1 and the value of the potentials Vdd and Gnd so that the difference between the potential Vdd and the potential Gnd is greater than the sum of these threshold voltages (i.e., Vdd−Gnd>Vtn+Vtp). In this way, it is ensured that the transistors MN1 and MP1 operate correctly. Furthermore the difference between the potential Vdd and the potential Gnd is in general as small as possible, so as to ensure operation of the circuit under the lowest possible supply voltage, thereby reducing the consumption of current and limiting the heating up of the circuit. The combination of these preferred characteristics leads to provide for the difference between the potential Vdd and the potential Gnd being slightly greater than the sum of the threshold voltages Vtn and Vtp of the transistors MN1 and MP1 respectively.

The right-hand part of the diagram of FIG. 5 depicts a symbol which is proposed in order to represent the buffer circuit 10 according to the invention. It is a triangle whose base is depicted by a double line. The input A is depicted on the side of this base and the output Z is depicted on the side of the vertex of the triangle. For the sake of simplicity, this symbol is used in FIGS. 9 and 10 instead of the diagram of the left-hand part of FIG. 5 which constitutes the detailed diagram of the buffer circuit 10 according to the invention.

Represented in FIG. 6 is a table giving the value of the potential $V_Z$ on the output Z of the buffer circuit 10 as a function of given values of the potential $V_A$ on the input A of the buffer circuit 10. This table makes it possible to illustrate the operation of the buffer circuit from an electrical standpoint. This operation is explained hereinbelow, by assuming that the potential Gnd is zero (ground potential), and that the potential Vdd is equal to +5 V (Volts) with respect to the potential Gnd. By considering that the output Z is floating, the potential $V_Z$ is necessarily at a positive value lying between 0 and +5 V.

When the potential $V_A$ is equal to the potential Gnd, the gate-source voltage Vgs of the transistor MN1 is equal to Gnd−$V_Z$. It is therefore negative. The transistor MN1 being an N type MOS transistor, it follows that this transistor is off. Likewise the gate-source voltage Vgs of the transistor MP1 is equal to Gnd−$V_Z$, that is to say it is negative. The transistor MP1 being a P type MOS transistor, it follows that this transistor is on. Consequently, the potential $V_Z$ is equal to the potential Vtp, which is the threshold voltage of the transistor MP1 (source-drain voltage).

When, conversely, the potential $V_A$ is equal to the potential Vdd, the gate-source voltage Vgs of the transistor MN1 is equal to $Vdd-V_Z$. It is therefore positive. The transistor MN1 is therefore on. Likewise the gate-source voltage Vgs of the transistor MP1 is equal to $Vdd-V_Z$, which is positive. The transistor MP1 is therefore off. Consequently, the potential $V_Z$ is equal to the potential Vdd-Vtn, that is to say to the potential Vdd minus the threshold voltage Vtn of the transistor MN1 (drain-source voltage).

The graph of FIG. 7 gives the shape of the potential $V_Z$ as a function of the potential $V_A$ when the latter decreases from Vdd to Gnd. From a logic standpoint, the buffer circuit behaves as the combination of two cascaded inverters. Specifically, the logic table of the buffer circuit 10, which is given in the table of FIG. 8, corresponds to that of two cascaded inverters.

Figure 2:
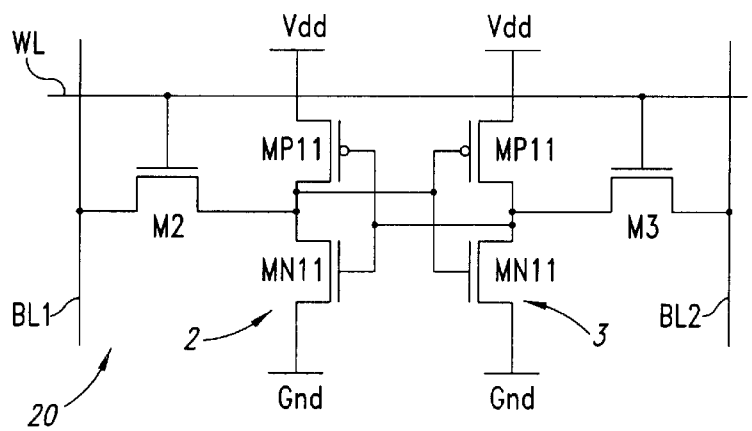
FIGS. 2, 3 and 4, also already described above, are diagrams of respective memory cells known in the prior art.
Figure 3:
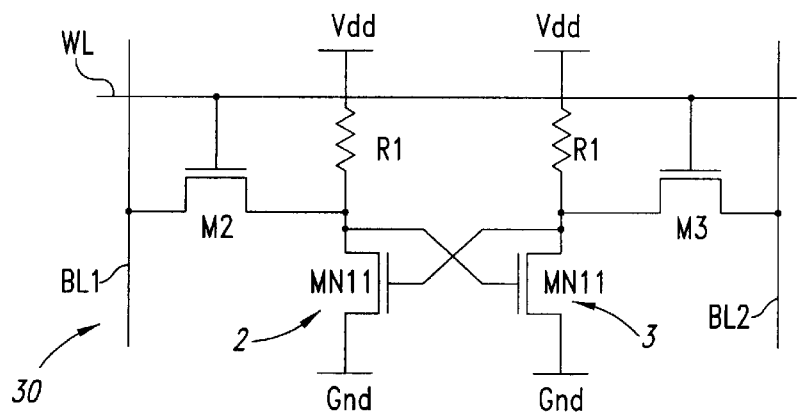
Figure 4:
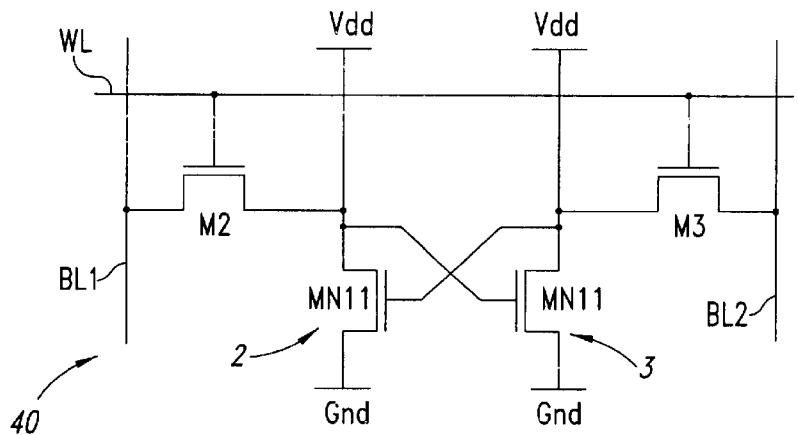

In conclusion, the buffer circuit 10, according to the invention behaves from the logic standpoint as the buffer circuit consisting of the two inverters 2 and 3 in CMOS technology represented in the diagram of FIG. 2, but comprises just two MOS transistors instead of four. This simplification is obtained at the cost of a degradation of the electrical levels delivered at the output Z with respect to those provided at the input A, which results from the threshold voltages Vtn and Vtp of the transistors MN1 and MP1 respectively. However, this is not actually a drawback considering that today MOS transistors can be fabricated which have a threshold voltage of the order of 0.4 to 0.5 V, this being relatively low, and considering further that these values will probably decrease even further in the coming years.

It is possible to obtain a logic latch consisting of a buffer circuit such as the buffer circuit 10 described hereinabove, whose output Z is linked to the input A. This allows the application of the buffer circuit, in particular, to the making of memory cells.

FIG. 9 and FIG. 10 show diagrammatically two respective examples of such memory cells.

These memory cells may be included within a memory of SRAM type (standing for Static RAM) or DRAM type (standing for Dynamic RAM). In addition to the logic latch, a memory cell comprises one or more access transistors, which make it possible to access the memory point either in read mode or in write mode, or in read and write mode. These access transistors are linked to lines for accessing the memory plane of the memory, which are bit lines or word lines.

Thus, in the example according to FIG. 9, the memory cell 100 furthermore comprises a write-access transistor M3 disposed between node 11 which can be linked to a bit line BL of a memory incorporating the memory cell 100 on the one hand and the input A of the buffer circuit 10 on the other hand. The control gate of the transistor M3 is linked to another node 12 which can be linked to a write word line WLW of the memory.

The write-access transistor M3 can be an N type (as in the example represented) or P type MOS transistor. The memory incorporating the memory cell 100 comprises means for, during a write operation in the memory cell, bringing the write word line WLW to the high logic state in the first case or to the low logic state in the second case respectively, so as to turn on the transistor M3.

The memory cell 100 also comprises a read-access transistor M4 disposed between the node 11 on the one hand and another node 13 on the other hand, it being possible for the latter to be linked to a read word line WLR1 of the memory. The control gate of the transistor M4 is linked to the output Z of the buffer circuit 10.

The read-access transistor M4 can be an N type or P type MOS transistor. In the first case, the memory incorporating the memory cell 100 comprises means for precharging the bit line BL to the potential Vdd and for putting the read word line WLR1 in the low logic state during a read operation in the memory cell 200. In the second case, the memory incorporating the memory cell 100 comprises means for precharging the bit line BL to the potential Gnd and for putting the read word line WLR1 in the high logic state during a read operation in the memory cell 200. A detection circuit (also known as a sense circuit in the literature), which is not represented, allows in either case the detection of any change in the charge of the bit line BL resulting from the reading of the logic value stored in the memory cell 200.

In the example according to FIG. 10, the memory cell 200 furthermore comprises a write- and read-access transistor M5 disposed between a node 14 on the one hand, and the input A of the buffer circuit 10 on the other hand. The node 14 can be linked to a bit line BL of a memory incorporating the memory cell 200. The control gate of the transistor M5 is linked to another node 15. The node 15 can be linked to a read and write word line WLRW of the memory.

The write- and read-access transistor M5 can be an N type or P type MOS transistor. In the first case, the memory incorporating the memory cell 200 comprises means for bringing the read and write word line WLRW to a high logic potential during a read operation or a write operation in the memory, so as to turn on the transistor M5, and to the low logic state the rest of the time so as to turn off the transistor M5, so that the logic value stored in the memory cell 200 is not copied over to the bit line BL. For the same reasons, in the second case, the said memory comprises means for bringing the line WLRW to a low logic state during a read operation or a write operation in the memory, and to the high logic state the rest of the time.

During a read operation, the transistor M5 is turned on, whereupon the value stored in the memory cell is sensed on the bit line. During a write operation, a value to be stored in the memory cell is held on the bit line and the transistor M5 is turned on, causing the value on the bit line to be transferred to the memory cell.

The memory cell 200 furthermore comprises a read-protection transistor M6 disposed between the input A and the output Z of the buffer circuit 10. Stated otherwise, the output Z of the buffer circuit 10 is not linked directly to its input A as in the case of FIG. 9, but it is linked thereto indirectly, through the transistor M6. The control gate of the transistor M6 is linked to a node 16 which can be linked to a read word line WLR2 of the memory incorporating the memory cell 200.

The read-protection transistor M6 can be an N type or P type MOS transistor. In the first case, the memory incorporating the memory cell 200 comprises means for bringing the read word line WLR2 to a low logic state during a read operation in the memory cell, so as to turn off the transistor M6. The aim of this is to prevent the read operation from deleting the data stored in the memory cell 200 (i.e., to render the read operation non destructive). Refreshing of the data stored in the memory cell, which otherwise would be necessary for each read operation in the memory cell 200, is thus avoided. For the same reasons, in the second case, the memory incorporating the memory cell 200 comprises means for bringing the read word line WLR2 to a high logic state during a read operation in the memory cell.

The memory cell examples 100 and 200 described hereinabove are especially suitable for the making of SRAM type random access memories. Nevertheless, many other memory cell structures may be contemplated without departing from the scope of the present invention.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A memory cell, comprising:
    a buffer circuit having an N type MOS transistor and a P type MOS transistor disposed in series between a first terminal which is brought to a first given potential and a second terminal which is brought to a second given potential, said second potential being less than said first potential, wherein said transistors have respective sources that are linked together and form an output of the buffer circuit, wherein said transistors have control gates that are linked together and form an input of the buffer circuit, wherein the N type MOS transistor has a drain that is linked to said first terminal and the P type MOS transistor has a drain that is linked to said second terminal, and wherein further the output of the buffer circuit is linked to the input of the buffer circuit so as to form a logic latch;
    a write-access transistor disposed between a first node linked to a bit line and the input of the buffer circuit, wherein a control gate of said write-access transistor is linked to a second node linked to a write word line, and
    a read-access transistor disposed between the first node linked to the bit line and a third node linked to a read word line, wherein a control gate of said read-access transistor is linked to the output of the buffer circuit.

2. A memory cell, comprising:
    a buffer circuit having an N type MOS transistor and a P type MOS transistor disposed in series between a first terminal which is brought to a first given potential and a second terminal which is brought to a second given potential, said second potential being less than said first potential, wherein said transistors have respective sources that are linked together and form an output of the buffer circuit, wherein said transistors have control gates that are linked together and form an input of the buffer circuit, wherein the N type MOS transistor has a drain that is linked to said first terminal and the P type MOS transistor has a drain that is linked to said second terminal, and wherein further the output of the buffer circuit is linked to the input of the buffer circuit so as to form a logic latch;
    a write- and read-access transistor disposed between a primary node linked to a bit line and the input of the buffer circuit, wherein a control gate of said write- and read-access transistor is linked to a secondary node linked to a read and write word line; and
    a read-protection transistor disposed between the input and the output of the buffer circuit, wherein a control gate of said read-protection transistor is linked to a node linked to a read word line.

3. A random access memory having a memory cell, wherein said memory cell comprises:
    a buffer circuit having an N type MOS transistor and a P type MOS transistor disposed in series between a first terminal which is brought to a first given potential and a second terminal which is brought to a second given potential, said second potential being less than said first potential, wherein said transistors have sources that are linked together and form an output of the buffer circuit, wherein said transistors have control gates that are linked together and form an input of the buffer circuit, wherein the N type MOS transistor has a drain that is linked to said first terminal and the drain of the P type MOS transistor is linked to said second terminal, and wherein further the output of the buffer circuit is linked to the input of the buffer circuit so as to form a logic latch; and
    a bit line and a write word line;
    a write-access transistor disposed between a first node linked to said bit line and the input of the buffer circuit, and wherein a control gate of said write-access transistor is linked to a second node linked to said write word line;
    a read word line; and
    a read-access transistor disposed between the first node linked to said bit line and a third node linked to said read word line, and wherein a control gate of said read-access transistor is linked to the output of the buffer circuit.

4. A random access memory having a memory cell, wherein said memory cell comprises:
    a buffer circuit having an N type MOS transistor and a P type MOS transistor disposed in series between a first terminal which is brought to a first given potential and a second terminal which is brought to a second given potential, said second potential being less than said first potential, wherein said transistors have sources that are linked together and form an output of the buffer circuit, wherein said transistors have control gates that are linked together and form an input of the buffer circuit, wherein the N type MOS transistor has a drain that is linked to said first terminal and the drain of the P type MOS transistor is linked to said second terminal, and wherein further the output of the buffer circuit is linked to the input of the buffer circuit so as to form a logic latch;
    a bit line and a read and write word line;
    a write- and read-access transistor disposed between a primary node linked to said bit line and the input of the buffer circuit, and wherein a control gate of said write- and read-access transistor is linked to a secondary node linked to said read and write word line;
    a read word line; and
    a read-protection transistor disposed between the input and the output of the buffer circuit, wherein a control gate of said read-protection transistor is linked to a node linked to said read word line.

5. A method, comprising:
    storing a bit of data in a memory cell and reading the bit of data stored in the memory cell, wherein the memory cell includes:
        an N type MOS transistor having a drain terminal connected to a first voltage supply at a first potential, a source terminal connected to a first node and a control terminal connected to a second node,
        a P type MOS transistor having a drain terminal connected to a second voltage supply at a second voltage potential, lower than the first potential, a source terminal connected to the first node and a control terminal connected to the second node, and a coupling element between the first and second nodes; and wherein the storing step includes:

applying the first potential to the first node if a first logic level is to be stored; or applying the second potential to the first node if a second logic level is to be stored;

wherein the applying steps comprise:

applying the first or second potential to a first conduction terminal of a write-access transistor, wherein a second conduction terminal of the write-access transistor is coupled to the second node; and turning on the write access transistor;

and wherein the reading step comprises:

charging a first conduction terminal of a read-access transistor to a first read potential;

applying a second read potential, different from the first read potential, to a second conduction terminal of the read-access transistor, wherein a control terminal of the read-access transistor is coupled to the first node; and sensing a possible change in the charge at the first conduction terminal.

6. A method, comprising:

storing a bit of data in a memory cell and reading the bit of data stored in the memory cell, wherein the memory cell includes:

an N type MOS transistor having a drain terminal connected to a first voltage supply at a first potential, a source terminal connected to a first node and a control terminal connected to a second node, a P type MOS transistor having a drain terminal connected to a second voltage supply at a second voltage potential, lower than the first potential, a source terminal connected to the first node and a control terminal connected to the second node, and a coupling element between the first and second nodes, including a read-protect transistor having first and second conduction terminals coupled to the first and second nodes, respectively; and wherein the storing step includes:

applying the first potential to the first node if a first logic level is to be stored; or applying the second potential to the first node if a second logic level is to be stored wherein the reading step comprises:

uncoupling the coupling element between the first and second nodes, the uncoupling step including turning off the read-protect transistor;

turning on a write and read access transistor; and sensing a logic level at the first conduction terminal of the write and read access transistor.

* * * * *